(12) United States Patent
Liu et al.

(10) Patent No.: US 11,730,039 B2
(45) Date of Patent: Aug. 15, 2023

(54) METHOD FOR FABRICATING TOUCH DISPLAY SUBSTRATE

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Chunwei Wu, Beijing (CN); Xiaoliang Ding, Beijing (CN); Rui Xu, Beijing (CN); Lijun Zhao, Beijing (CN); Changfeng Li, Beijing (CN); Yanan Jia, Beijing (CN); Yuzhen Guo, Beijing (CN); Yunke Qin, Beijing (CN); Pinchao Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 537 days.

(21) Appl. No.: 16/868,161

(22) Filed: May 6, 2020

(65) Prior Publication Data
US 2020/0273920 A1 Aug. 27, 2020

Related U.S. Application Data

(62) Division of application No. 15/688,289, filed on Aug. 28, 2017, now abandoned.

(30) Foreign Application Priority Data

Jan. 3, 2017 (CN) .......................... 201710002672.X (51) Int. Cl.
*H10K 59/40* (2023.01)
*G06F 3/044* (2006.01)
(Continued)

(52) U.S. Cl.
CPC ............. *H10K 59/40* (2023.02); *B32B 37/06* (2013.01); *C23C 14/34* (2013.01); *G06F 3/0443* (2019.05);
(Continued)

(58) Field of Classification Search
None
See application file for complete search history.

(56) References Cited

U.S. PATENT DOCUMENTS

| 2015/0177884 A1 | 6/2015 | Han |
| 2016/0103537 A1 | 4/2016 | Park et al. |
| 2017/0083147 A1 | 3/2017 | Su et al. |

FOREIGN PATENT DOCUMENTS

| CN | 103928493 A | 7/2014 |
| CN | 105374467 A | 3/2016 |

OTHER PUBLICATIONS

Li et al, CN 104036878A, A method for preparing three-dimensional structure material of graphene and carbon nanotube, Jun. 24, 2014. (Year: 2014).*

(Continued)

*Primary Examiner* — Alexander G Ghyka
(74) *Attorney, Agent, or Firm* — Brooks Kushman P.C.

(57) ABSTRACT

A method for fabricating a touch display substrate and a touch display substrate are provided to solve the problem that existing touch electrodes of the micron-scale line width cannot meet the high PPI requirement. The fabrication method includes forming functional layers of an organic light-emitting diode (OLED) device on a base substrate sequentially to obtain an OLED substrate; and forming a linear touch electrode with a nano-scale line width on the OLED substrate by electronic sputtering and transferring.

7 Claims, 7 Drawing Sheets

(51) Int. Cl.
*C23C 14/34* (2006.01)
*B32B 37/06* (2006.01)

(52) U.S. Cl.
CPC ...... *B32B 2457/208* (2013.01); *G06F 3/0445* (2019.05); *G06F 2203/04103* (2013.01); *G06F 2203/04112* (2013.01); *Y10T 29/49117* (2015.01)

(56) References Cited

OTHER PUBLICATIONS

Hu et al, CN 104677509A, using the technique of nano mask processing nanowire single photon detector, Jun. 3, 2015 (Year: 2015).*
First Office Action for Chinese Application No. 201710002672.X, dated Feb. 15, 2019, 9 Pages.
U.S. Office Action dated Aug. 9, 2019, U.S. Appl. No. 15/688,289, 15 Pages.

* cited by examiner

METHOD FOR FABRICATING TOUCH DISPLAY SUBSTRATE

CROSS-REFERENCE TO RELATED APPLICATIONS

This application is a divisional of U.S. application Ser. No. 15/688,289 filed Aug. 28, 2017, which claims priority to Chinese Patent Application No. 201710002672.X filed on Jan. 3, 2017, which are incorporated herein by reference in their entireties.

TECHNICAL FIELD

The present disclosure relates to the field of touch display substrate, and in particular, to a method for fabricating a touch display substrate and a touch display substrate.

BACKGROUND

At present, for OLED (Organic Light-Emitting Diode) touch screens, the touch function is mainly implemented through an on-cell approach. Touch electrodes are formed usually by using a printing or photolithography process, and the touch electrodes are formed in the non-opening zone between pixels. Since the touch electrodes formed by the printing or photolithography process can merely obtain micron-scale dimensions, it is difficult to ensure that the touch electrodes are all arranged in the non-opening zone of the OLED display having a high PPI (Pixels Per Inch). For example, with the existing printing process, a minimum line width of approximately 30 um can be obtained, the line spacing is at least above 20 um, and there is a relatively low printing location precision, resulting in a deviation of at least several microns. Therefore, the printed metals may be positioned within the display pixels, which adversely affects the display quality and leads to a low yield of the touch screen.

In generally, the requirement on the resolution of OLED touch screens becomes higher and higher and the line width of the touch electrode formed by the printing or photolithography process can merely reach the micron level, and therefore it is difficult to meet the high PPI requirement.

SUMMARY

A method for fabricating a touch display substrate and a touch display substrate are provided according to the embodiments of the present disclosure to solve the problem that the line width of the touch electrode formed by the printing or photolithography process can merely reach the micron level and it is difficult to meet the requirement of high PPI, since the requirement on the resolution of the OLED touch screen becomes higher and higher.

Some embodiments of the present disclosure provide a method for fabricating a touch display substrate, which includes: forming functional layers of an organic light-emitting diode (OLED) device on a base substrate sequentially to obtain an OLED substrate; and forming a linear touch electrode with a nano-scale line width on the OLED substrate by electronic sputtering and transferring.

Optionally, the forming a linear touch electrode with a nano-scale line width on the OLED substrate by electronic sputtering and transferring includes: sputtering a metal conductive material on a carrier having a pattern of a nano-scale metal line by electronic sputtering, to form a metal conductive material line with a nano-scale line width on the metal line; and transferring the metal conductive material line with the nano-scale line width formed on the metal line onto the OLED substrate by transferring, to form the linear touch electrode with the nano-scale line width on the OLED substrate.

Optionally, the carrier having the pattern of the nano-scale metal line is formed by: forming a nano-scale metal line on a body of the carrier using an electronic beam lithography.

Optionally, the method further includes, before the transferring the metal conductive material line with the nano-scale line width formed on the metal line onto the OLED substrate by transferring: performing an alignment operation on the OLED substrate and the metal conductive material line with the nano-scale line width formed on the carrier.

Optionally, the alignment operation includes a rough alignment operation and a fine alignment operation, the rough alignment operation comprises aligning the metal conductive material line with the nano-scale line width with a display region of the OLED substrate, and the fine alignment operation comprises aligning the metal conductive material line with the nano-scale line width with a non-opening zone in the display region.

Optionally, the transferring the metal conductive material line with the nano-scale line width formed on the metal line onto the OLED substrate includes: enabling the metal conductive material line with the nano-scale line width to contact the OLED substrate under a preset condition, to separate the metal conductive material line with the nano-scale line width from the metal line of the carrier, and transfer the metal conductive material line with the nano-scale line width onto the OLED substrate.

Optionally, the preset condition includes at least one of: applying an external force, applying a voltage, illuminating and heating.

Some embodiments of the present disclosure provides a touch display substrate fabricated by the above-described method, which includes: a base substrate, an OLED device arranged on the substrate, and a linear touch electrode with a nano-scale line width arranged on the OLED device, and the touch electrode is arranged in a display region of the touch display substrate.

Optionally, the line width of the touch electrode is less than or equal to 190 nm.

Optionally, the OLED device includes: an organic light-emitting layer. An orthographic projection of the touch electrode on the base substrate partially overlaps with an orthographic projection of a pattern of the organic light-emitting layer on the base substrate, or the touch electrode is arranged in a non-opening zone in the display region.

Optionally, the touch electrode has a single-layer self-capacitance structure, a single-layer mutual-capacitance structure, or a double-layer mutual-capacitance structure.

Optionally, the touch electrode is a fingerprint electrode.

Optionally, the touch electrode is made of a transparent material.

Optionally, the touch electrode is made of at least one of: carbon nanotube conductive particles, nano silver, and graphene.

Optionally, the touch display substrate is an in-cell touch display substrate, or an on-cell touch display substrate.

The present disclosure has following advantages: for the method for fabricating a touch display substrate and the touch display substrate fabricated with the method according to the embodiments of the present disclosure, the touch electrode is formed to be a linear electrode with a nano-scale line width, and the width of the touch electrode is reduced. The line width of the touch electrode is less than or close to the wavelength of the visible light, and thus the visible light may not be prevented from entering the human's eyes, even though the touch electrode is arranged in the display region. As a result, the aperture ratio may be increased and the yield of product is improved, so that the fabricated touch display substrate is more adapted to the product which has a high PPI requirement.

DETAILED DESCRIPTION

The technical solutions in embodiments of the present disclosure are described clearly and completely in conjunction with the accompanying drawings of the embodiments of the present disclosure hereinafter. It is evident that the described embodiments are only a part of embodiments of the present disclosure. Other embodiments obtained by those skilled in the art on the basis of the described embodiments of the present disclosure without creative work fall within the protection scope of the present disclosure.

The thickness of a film and the shape of a region in the accompanying drawings does not reflect a real scale, and is only intended to schematically illustrate the present disclosure.

For the touch display substrate according to the embodiments of the present disclosure, the linear touch electrode is formed to have a nano-scale line width on the basis of the existing touch display substrate, and thus the visible light may not be prevented from entering the human's eyes, even though the touch electrode is arranged above the pixels in the display region. Merely the touch electrode with a micron-scale line width may be formed by the method for fabricating a touch display substrate in the related art. The embodiments of the present disclosure provide a method for fabricating a touch display substrate and the structure of a touch display substrate fabricated by the method. The specific fabrication method is illustrated in detail below.

Figure 1:
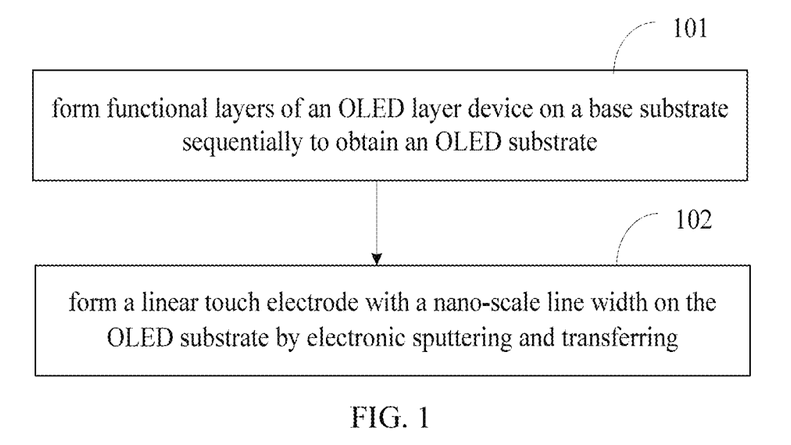
FIG. 1 is a flowchart of a method for fabricating a touch display substrate according to some embodiments of the present disclosure.

As shown in FIG. 1, a flowchart of a method for fabricating a touch display substrate according to some embodiments of the present disclosure is provided. The method may be specifically implemented with the following steps.

At step 101, functional layers of an organic light-emitting diode (OLED) device are sequentially formed on a base substrate to obtain an OLED substrate.

At step 102, a linear touch electrode with a nano-scale line width is formed on the OLED substrate by electronic sputtering and transferring.

In a specific implementation, in the method for fabricating the touch display substrate according to the embodiments of the present disclosure, the linear touch electrode with a nano-scale line width can be formed on the OLED substrate by electronic sputtering and transferring. The specific fabrication method for the functional layers of the OLED device is not limited herein.

At present, the requirement on the resolution of the OLED touch screen becomes higher and higher, the line width of the touch electrode formed by a printing or photolithography process can merely reach the micron level, therefore, it is difficult to meet the high PPI requirement.

In view of the above, for the above-described method for fabricating a touch display substrate according to the embodiments of the present disclosure, the linear touch electrode with a nano-scale line width may be formed by electronic sputtering and transferring, and the width of the touch electrode is reduced. The line width of the touch electrode is less than or close to the wavelength of the visible light, and therefore the visible light may not be prevented from entering the human's eyes even though the touch electrode is arranged above the pixels in the display region. As a result, the aperture ratio may be increased and the yield of product is improved, so that the fabricated touch display substrate is more adapted to the product which has a high PPI requirement.

In the above-described method for fabricating the touch display substrate according to the embodiments of the present disclosure, the linear touch electrode with the nano-scale line width may be formed on the OLED substrate by electronic sputtering and transferring. The specific steps of electronic sputtering and transferring are illustrated in detail hereinafter.

Figure 2:
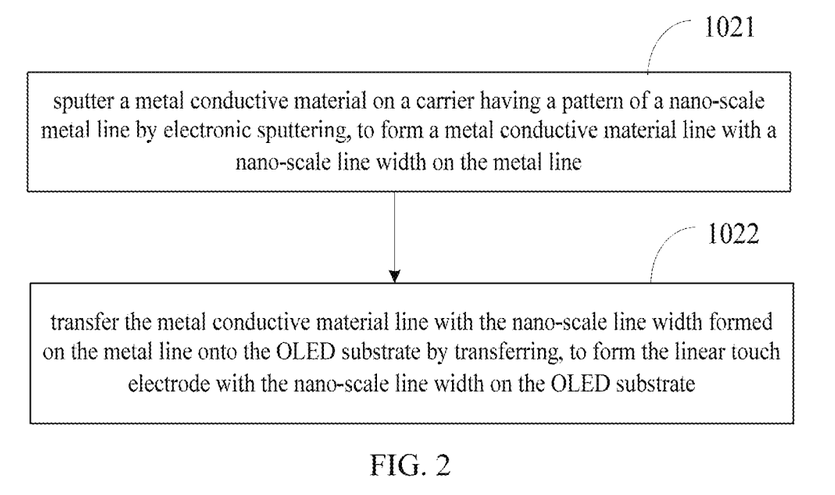
FIG. 2 is a flowchart of an electronic sputtering and transferring step according to some embodiments of the present disclosure.

FIG. 2 is a flowchart of an electronic sputtering and transferring step according to some embodiments of the present disclosure. Optionally, in a specific implementation, the step 102 may be specifically implemented with the following steps.

At step 1021, a metal conductive material is sputtered on a carrier having a pattern of a nano-scale metal line by electronic sputtering, to form a metal conductive material line with a nano-scale line width on the metal line.

At step 1022, the metal conductive material line with a nano-scale line width formed on the metal line is transferred onto the OLED substrate by transferring, to form a linear touch electrode with a nano-scale line width on the OLED substrate.

Figure 3A:
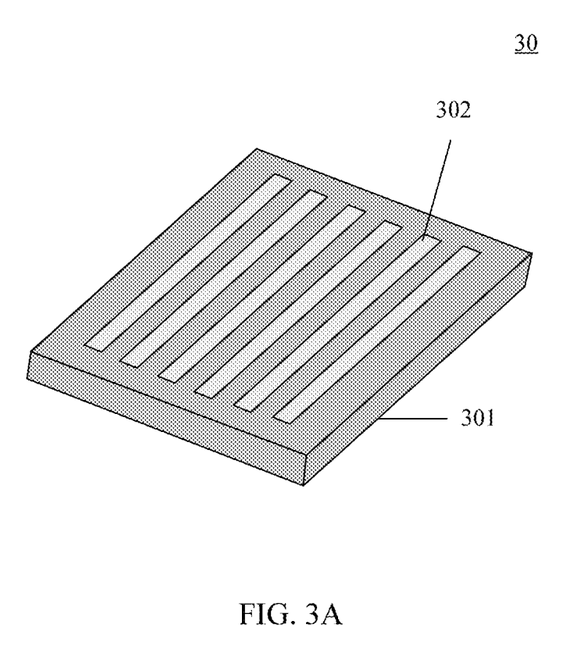
FIG. 3A is a schematic structural diagram of a carrier having a pattern of a nano-scale metal line according to some embodiments of the present disclosure.

In a specific implementation, in implementing the above step 1021, firstly the carrier having the pattern of the nano-scale metal line pattern is formed. FIG. 3A is a schematic structural diagram of a carrier having a pattern of a nano-scale metal line according to some embodiments of the present disclosure. Optionally, the following operation is used to form the carrier having the pattern of the nano-scale metal line: forming at least one nano-scale metal line 302 on the body 301 of the carrier using an electronic beam lithography.

Specifically, the carrier is formed generally using a particular instrument, for example, a pattern of 20 nm (or hundreds nm)-width metal lines may be formed on the body 301 of the carrier using the electronic beam lithography to obtain the carrier 30 having the pattern of a nano-scale metal line.

The specific width and number of the nano-scale metal line may be formed based on the width and number of the touch electrode to be formed, and the nano-scale metal line formed on the carrier has a one-to-one correspondence to the touch electrode to be formed.

Figure 3B:
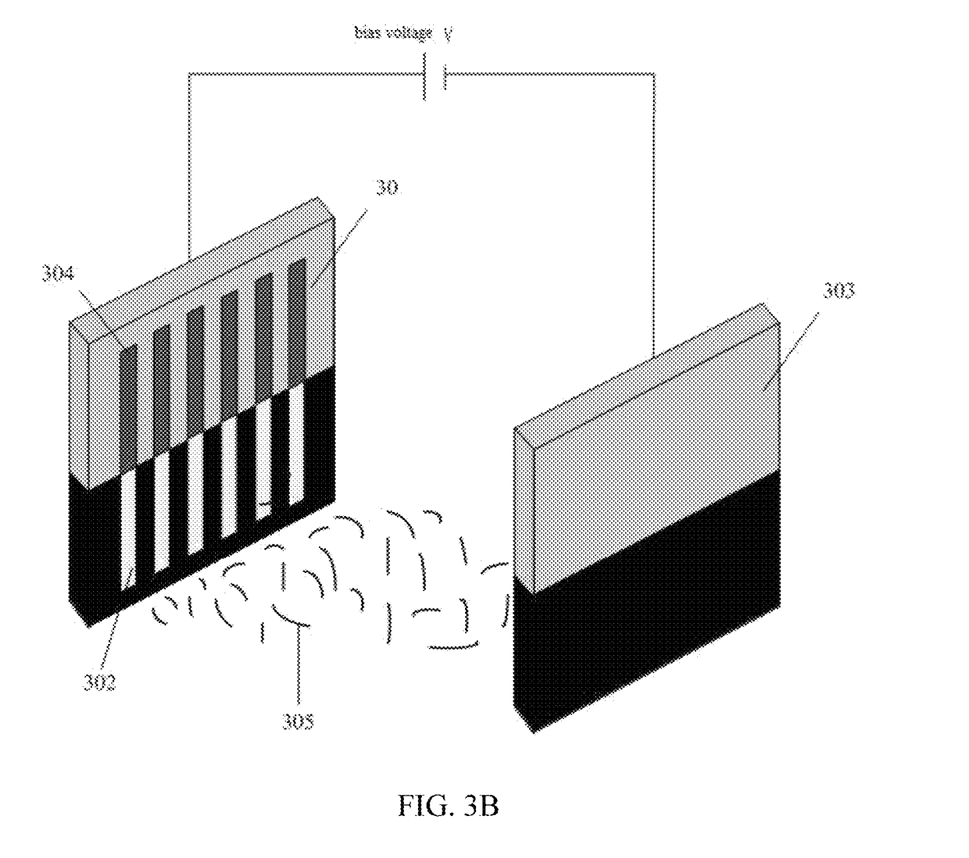
FIG. 3B is a schematic structural diagram in an electronic sputtering process according to some embodiments of the present disclosure.

After the carrier having the pattern of the nano-scale metal line is formed, a metal conductive material is sputtered on the carrier by electronic sputtering to form a metal conductive material line with a nano-scale line width on the metal line. FIG. 3B is a schematic structural diagram in an electronic sputtering process according to some embodiments of the present disclosure.

In the electronic sputtering process, the carrier 30 having the pattern of nano-scale metal lines is connected to a target material 303 of the metal conductive material via a bias voltage V. In this case, the metal material above the whole surface may be deposited on the nano-scale metal lines 302 of the carrier in the electronic sputtering way under the action of the voltage, no nano-scale metal line is arranged at other position on the body 301 of the carrier, and no metal conductive material is sputtered at other position on the body 301 of the carrier. Thus, the metal conductive material lines 304 with a nano-scale line width may be formed on the nano-scale metal line 302, and the reference numeral 305 represents metal conductive particles in the sputtering process in FIG. 3B.

Figure 4A:
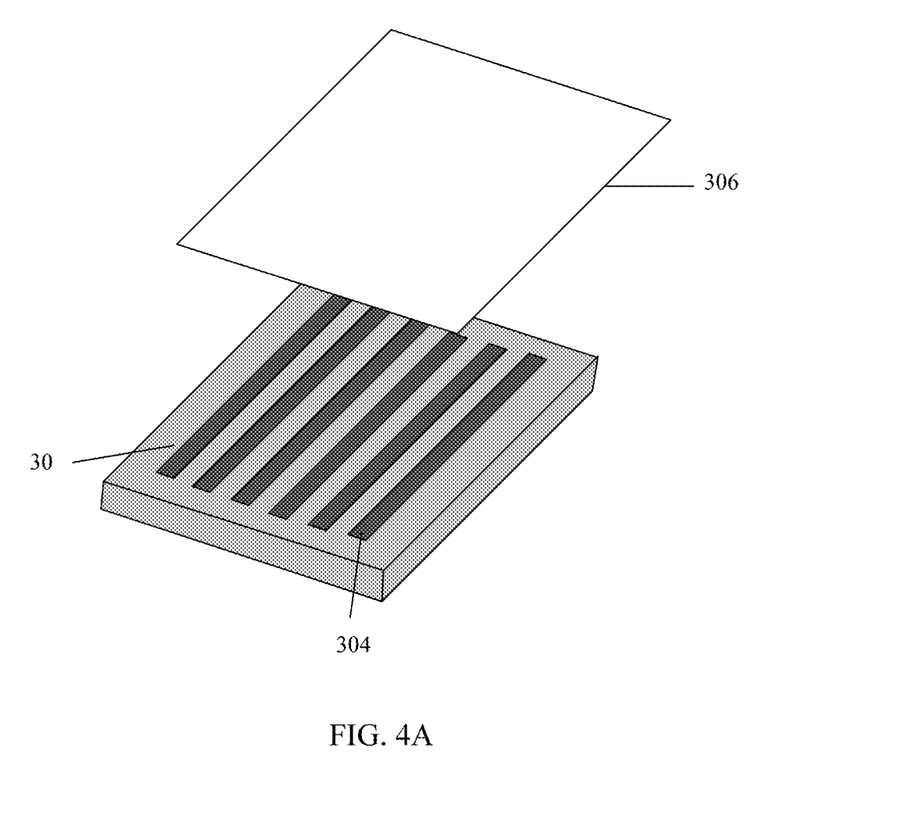
FIG. 4A is a schematic structural diagram in a transferring process according to some embodiments of the present disclosure.

In a specific implementation, in implementing the above step 1022, the linear touch electrode is formed on the OLED substrate by transferring. FIG. 4A is a schematic structural diagram in a transferring process according to some embodiments of the present disclosure.

Figure 4B:
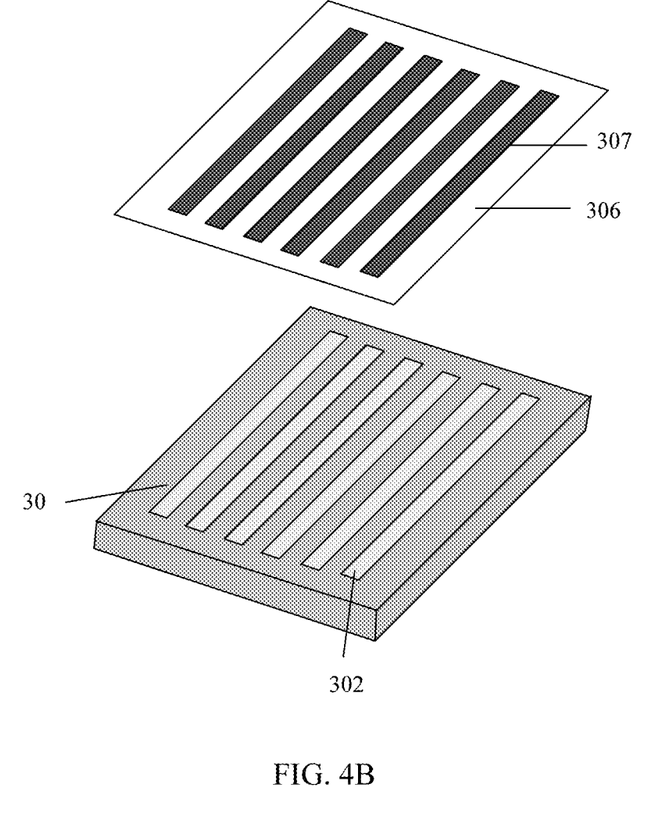
FIG. 4B is a schematic structural diagram after the transferring process according to some embodiments of the present disclosure.

Specifically, the metal conductive material lines 304 with the nano-scale line width formed on the metal line 302 of the carrier in step 1021 are transferred onto the OLED substrate 306 formed at step 101. As shown in FIG. 4B which is a schematic structural diagram after the transferring process according to some embodiments of the present disclosure, the linear touch electrodes 307 with a nano-scale line width are formed on the OLED substrate 306 (that is, the touch display substrate), that is, the metal conductive material lines 304 with the nano-scale line width formed on the metal lines 302 of the carrier are transformed into the touch electrode 307 on the OLED substrate.

In the transferring process, optionally, transferring the metal conductive material line with a nano-scale line width formed on the metal line onto the OLED substrate includes: enabling the metal conductive material lines 304 with the nano-scale line width to contact the OLED substrate 306 under a preset condition, to separate the metal conductive material lines 304 with the nano-scale line width from the metal lines 302 on the carrier, and transfer the metal conductive material lines 304 with the nano-scale line width onto the OLED substrate 306.

Optionally, the preset condition includes, but is not limited to one or more of the following conditions: applying an external force, applying a voltage, illuminating and heating. That is, the metal conductive material lines 304 sputtered on the carrier may be transferred onto the OLED substrate on which the linear touch electrodes are required to be formed by applying a force, by illuminating or by heating.

In a specific implementation, the materials of the carrier and the metal line are selected based on the actual requirements, otherwise it is difficult to transfer the metal conductive material lines onto the OLED substrate. For example, the nano-scale metal lines on the carrier are made of a metal material which may be attached closely on the carrier, and the metal conductive material to be transferred is a material which may fall off easily when subjected to an external force, electricity, illuminating or heating.

Before the transferring process, in order to precisely transfer the metal conductive material lines 304 sputtered on the carrier onto a designated position on the OLED substrate 306, optionally, before the step 1022, the method further includes: performing an alignment operation on the OLED substrate 306 and the metal conductive material lines 304 with the nano-scale line width formed on the carrier 30.

Optionally, the alignment operation includes a rough alignment operation and a fine alignment operation. The two alignment operations are briefly illustrated below.

Figure 5A:
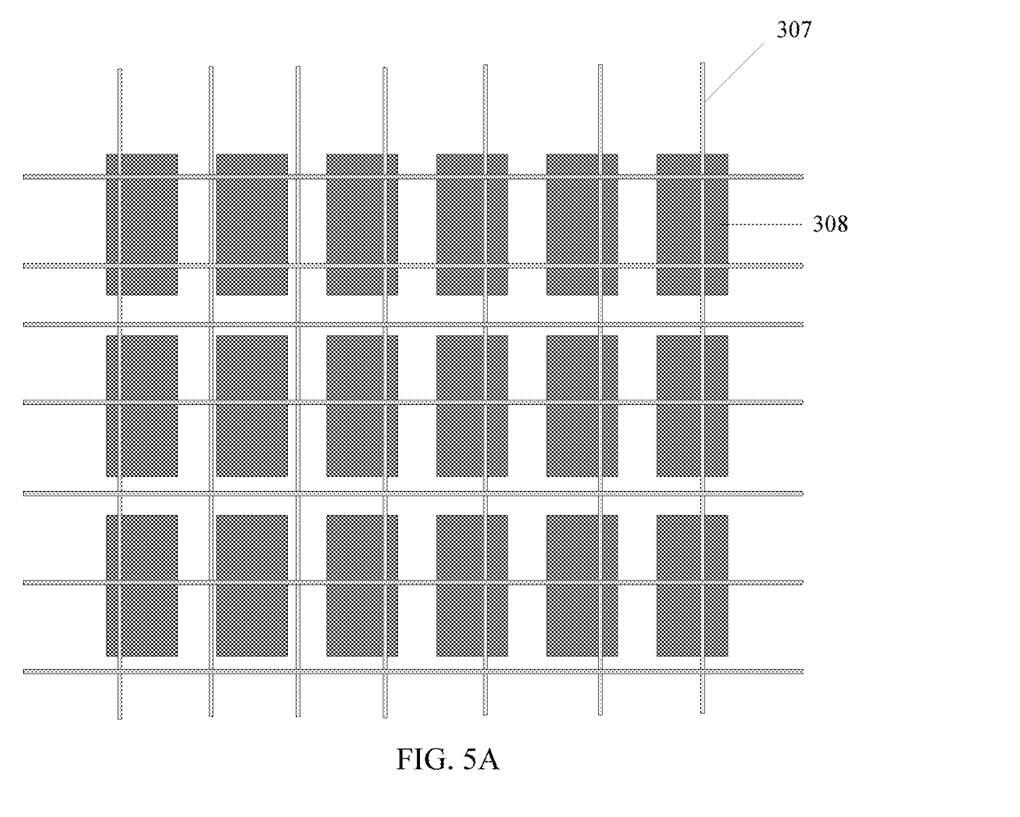
FIG. 5A is a schematic structural diagram of linear touch electrodes after a rough alignment operation according to some embodiments of the present disclosure.

Specifically, the rough alignment operation comprises aligning the metal conductive material lines 304 with the nano-scale line width with a display region of the OLED substrate 306. The precision of the rough alignment operation may be several microns or tens of microns. It is sufficient that the linear touch electrodes 307 obtained after the transferring process are located in the display region, and it is not necessary to arrange the linear touch electrodes 307 in a non-opening zone in the display region. FIG. 5A is a schematic structural diagram of linear touch electrodes after the rough alignment operation according to some embodiments of the present disclosure.

Figure 5B:
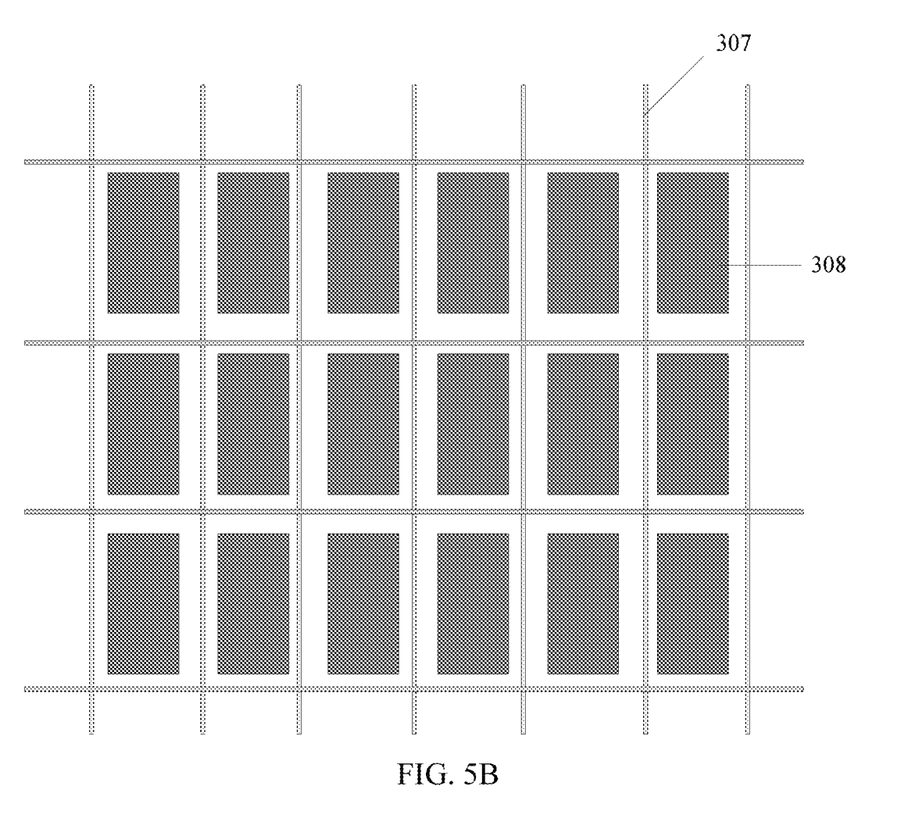
FIG. 5B is a schematic structural diagram of linear touch electrodes after a fine alignment operation according to some embodiments of the present disclosure.

Additionally, the fine alignment operation comprises aligning the metal conductive material lines 304 with the nano-scale line width with the non-opening zone in the display region. The fine alignment operation has a high requirement on the precision of the equipment, and the precision is needed to be at the nanometer level. The linear touch electrodes 307 obtained after the transferring process are located in the non-opening zone in the display region. FIG. 5B is a schematic structural diagram of linear touch electrodes after the fine alignment operation according to an embodiment of the present disclosure.

In a specific implementation, through either the rough alignment operation or the fine alignment operation, the linear touch electrode with a nano-scale line width may be formed on the OLED substrate. Generally, in the fabrication process, since the fine alignment operation has a high requirement on the precision of the equipment which has a high price, the rough alignment operation is selected usually. Although the touch electrode may exist on the display pixels 308 in the organic light-emitting layer of the OLED substrate, since the line width of the touch electrode is less than or close to the wavelength (380 nm to 780 nm) of the visible light, and therefore the light wavelength may not be prevented from entering the human's eyes, even though the touch electrode exists on the display pixels.

Figure 6:
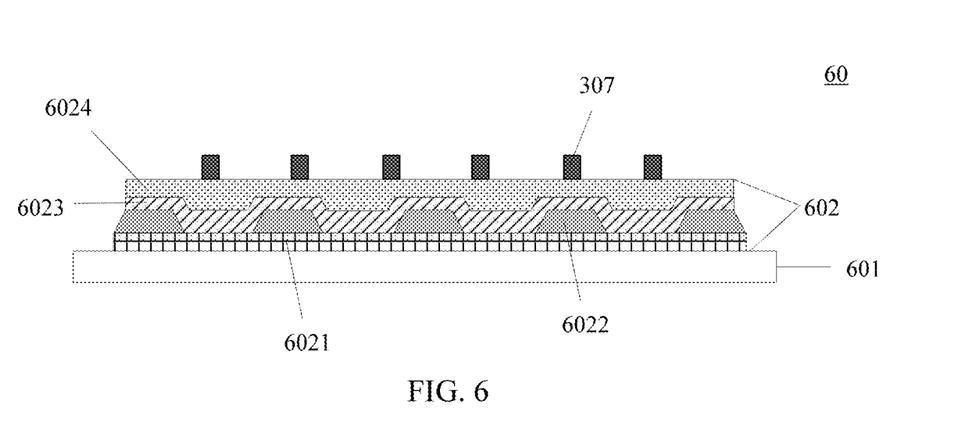
FIG. 6 is a schematic diagram of a basic structure of a touch display substrate fabricated by the above-mentioned method according to some embodiments of the present disclosure.

Base on the same inventive concept, a touch display substrate fabricated by the above-mentioned method is provided. FIG. 6 is a schematic diagram of a basic structure of a touch display substrate fabricated by the above-mentioned method according to some embodiments of the present disclosure. The touch display substrate 60 includes: a base substrate 601, an OLED device 602 arranged on the base substrate, and linear touch electrodes 307 with a nano-scale line width arranged on the OLED device. The touch electrodes 307 are arranged in a display region of the touch display substrate.

In a specific implementation, the linear touch electrodes 307 are arranged on the OLED device, the OLED device 602 generally includes a TFT (Thin Film Transistor) backboard 6021, an organic light-emitting layer 6022, a cathode layer 6023 and a TFE (Thin Film Encapsulation) layer 6024 arranged sequentially. Since the cathode layer 6023 substantially covering a whole surface of the OLED device 602 exists in the OLED device 602, if the touch electrodes are formed below the cathode layer 6023, signals may be shielded, the touch electrodes 307 can only be formed above the cathode layer 6023, and the touch electrodes 307 are generally formed between the TFE layer 6024 and a polarizing layer (not shown in FIG. 6). In order to better detect touch signals, the touch electrodes 307 are arranged in the display region of the touch display substrate.

In a specific implementation, since the wavelength of the visible light is in a range of 380 nm to 780 nm, the line width of the touch electrode is at least less than ½ of the wavelength of the visible light, in order to not affect the display. The maximum line width of the touch electrode is 380/2 being equal to 190 nm. Optionally, the line width of the touch electrode is less than or equal to 190 nm.

The line width of the touch electrode is less than or close to the wavelength of the visible light, and the visible light may not be prevented from entering the human's eyes even though the touch electrode is arranged above the pixels in the display region, and thus it is not necessary to arrange the touch electrode in the non-opening zone. Optionally, the OLED device 602 includes: an organic light-emitting layer 6022; an orthographic projection of the touch electrode 307 on the base substrate partially overlaps an orthographic projection of a pattern of the organic light-emitting layer 6022 on the base substrate, or the touch electrode 307 is arranged in a non-opening zone in the display region.

Specifically, the linear touch electrode with a nano-scale line width according to the embodiments of the present disclosure may be arranged at any position in the display region as required. As shown in FIG. 6, the touch electrodes 307 are arranged above the pattern of the organic light-emitting layer 6022, of which the schematic plan structure view may be seen in FIG. 5A; or the touch electrodes 307 may be arranged in the non-opening zone in the display region as required, of which the schematic plan structure view may be seen in FIG. 5B.

In a specific implementation, the linear touch electrode with a nano-scale line width fabricated according to the embodiment of the present disclosure may be arranged as required on any kind of touch display substrate in which the linear electrode is needed. Optionally, the touch electrode has a single-layer self-capacitance structure, a single-layer mutual-capacitance structure, or a double-layer mutual-capacitance structure.

For example, in the structure as shown in FIG. 5A and FIG. 5B, the touch electrodes have a double-layer mutual-capacitance structure, the touch electrodes include driving electrodes and sensing electrodes, and a touch capacitor is formed between each driving electrode and each sensing electrode. In fabricating the touch display substrate, the driving electrode and the sensing electrode is formed respectively by electronic sputtering and transferring, and a whole insulting layer is formed between the driving electrodes and the sensing electrodes.

The structures of the touch electrodes include a single-layer self-capacitance structure and a single-layer mutual-capacitance structure. The fabrication method for these two structure is the same as that for the double-layer mutual-capacitance structure, and the touch electrodes are formed by electronic sputtering and transferring, which is not illustrated in detail herein.

In a specific implementation, the fabrication method and the touch electrode according to the embodiments of the present disclosure may also be applied to a fingerprint electrode as required, besides being applied to an ordinary touch electrode. Optionally, the touch electrode is a fingerprint electrode.

The linear touch electrode according to the embodiment of the present disclosure is made of a metal conductive material. If the metal conductive material is non-transparent, reflecting may occur in the display process. Optionally, the material of the touch electrode is transparent. If the metal conductive material is transparent, there is no reflected light, resulting a better display effect.

Specifically, the material of the touch electrode may be selected as required. Optionally, the material of the touch electrode may be at least one of the following materials: carbon nanotube conductive particles, nano silver, and graphene.

In the touch display substrate according to the embodiments of the present disclosure, the touch electrode is linear. Optionally, the touch display substrate is an in-cell touch display substrate, or an on-cell touch display substrate. The touch electrode may be embedded into the display substrate, or may also be externally attached to the display substrate, as long as the touch operation can be implemented and the normal operation of the display substrate is not affected.

In summary, according to the method for fabricating a touch display substrate and the touch display substrate fabricated by the method according to the embodiments of the present disclosure, the touch electrode is formed to be a linear electrode with a nano-scale line width, and the width of the touch electrode is reduced. The line width of the touch electrode is less than or close to the wavelength of the visible light, and thus the visible light may not be prevented from entering the human's eyes even though the touch electrode is arranged above the pixels in the display region. As a result, the aperture ratio may be increased and the yield of product is improved, so that the fabricated touch display substrate is more adapted to the product which has a high PPI requirement.

It is evident to those skilled in the art that various modifications and variations may be made to the present disclosure without departing from the spirit and scope of the present disclosure. The present disclosure is intended to embrace such modifications and variations if the modifications and variations of this disclosure are within the scope of the claims of the present disclosure and the equivalents thereof.

What is claimed is:

1. A method for fabricating a touch display substrate, comprising:
    forming functional layers of an organic light-emitting diode (OLED) device on a base substrate sequentially to obtain an OLED substrate;
    sputtering a metal conductive material on a carrier having a pattern of a nano-scale metal line by electronic sputtering, to form a metal conductive material line with a nano-scale line width on the metal line, wherein the carrier having the pattern of the nano-scale metal line is formed by: forming a nano-scale metal line on a body of the carrier using an electronic beam lithography; and
    transferring the metal conductive material line with the nano-scale line width formed on the metal line onto the OLED substrate by transferring, to form the linear touch electrode with the nano-scale line width on the OLED substrate;

wherein the linear touch electrodes obtained after the transferring process are located in the non-opening zone in the display region;

in the sputtering process, the carrier having the pattern of nano-scale metal lines is connected to a target material of the metal conductive material via a bias voltage V, and in this case, the metal material above the whole surface is deposited on the nano-scale metal lines of the carrier in the electronic sputtering way under the action of the voltage, no nano-scale metal line is arranged at other position on the body of the carrier, and no metal conductive material is sputtered at other position on the body of the carrier; and the transferring the metal conductive material line with a nano-scale line width formed on the metal line onto the OLED substrate comprises: enabling the metal conductive material lines with the nano-scale line width to contact the OLED substrate under a preset condition, to separate the metal conductive material lines with the nano-scale line width from the metal lines on the carrier, and transfer the metal conductive material lines with the nano-scale line width onto the OLED substrate, wherein the preset condition comprises at least one of the following: applying an external force, applying a voltage, illuminating and heating.

2. The method according to claim 1, further comprising, before the transferring the metal conductive material line with the nano-scale line width formed on the metal line onto the OLED substrate by transferring:

performing an alignment operation on the OLED substrate and the metal conductive material line with the nano-scale line width formed on the carrier.

3. The method according to claim 2, wherein the alignment operation comprises a rough alignment operation and a fine alignment operation, the rough alignment operation comprises aligning the metal conductive material line with the nano-scale line width with a display region of the OLED substrate, and the fine alignment operation comprises aligning the metal conductive material line with the nano-scale line width with a non-opening zone in the display region.

4. The method according to claim 1, wherein the transferring the metal conductive material line with the nano-scale line width formed on the metal line onto the OLED substrate comprises:

enabling the metal conductive material line with the nano-scale line width to contact the OLED substrate under a preset condition, to separate the metal conductive material line with the nano-scale line width from the metal line of the carrier, and transfer the metal conductive material line with the nano-scale line width onto the OLED substrate.

5. The method according to claim 4, wherein the preset condition comprises at least one of:

applying an external force, applying a voltage, illuminating, and heating.

6. The method according to claim 1, wherein the line width of the touch electrode is less than or equal to 190 nm.

7. The method according to claim 1, wherein the touch electrode is made of at least one of:

carbon nanotube conductive particles, nano silver, and graphene.

* * * * *